United States Patent [19]

Taillebois et al.

[11] Patent Number: 4,719,346
[45] Date of Patent: Jan. 12, 1988

[54] OPTICAL POSITION LOCATING APPARATUS WITH BIDIRECTIONAL LIGHT TRANSMISSION

[75] Inventors: Jacques Taillebois, Plaisir; Jean-Marie Renaud, Courbevoie; Jean-Claude Perrot, Montigny en Cormeilles; Paul Gambs, Ecully, all of France

[73] Assignee: M.C.B., Courbevoie, France

[21] Appl. No.: 810,722

[22] Filed: Dec. 19, 1985

[30] Foreign Application Priority Data

Dec. 21, 1984 [FR] France .................. 84 19711

[51] Int. Cl.⁴ ............................................. G01D 5/34
[52] U.S. Cl. ......................... 250/231 SE; 250/237 G
[58] Field of Search ............ 250/231 SE, 237 G, 551; 356/395; 340/347 P; 33/125 C

[56] References Cited

U.S. PATENT DOCUMENTS 3,831,169 8/1974 Raser ............................. 340/347 P
4,117,460 9/1987 Walworth et al. ................. 250/227
4,124,839 11/1978 Cohen ............................. 340/151
4,536,649 8/1985 Kozai et al. ................. 250/231 SE

FOREIGN PATENT DOCUMENTS 0035885 3/1981 European Pat. Off. .

Primary Examiner—David C. Nelms
Attorney, Agent, or Firm—Antonelli, Terry, & Wands

[57] ABSTRACT

An optical position locating apparatus is provided which includes a first light reader with several photodetectors for reading the tracks of a disk, a first light emitter excited by the first light reader and a self contained power supply source. A module is provided which comprises a second light emitter, a second light reader and a processor for processing electric signals from the first light reader. An optical fiber system is provided for transmitting the electric signals to the second light reader. Optical systems are advantageously provided.

9 Claims, 2 Drawing Figures

OPTICAL POSITION LOCATING APPARATUS WITH BIDIRECTIONAL LIGHT TRANSMISSION

BACKGROUND OF THE PRESENT INVENTION

The present invention relates to optical apparatus for locating by diascopy the position of a mobile element.

It is known that such an apparatus comprises, a disk or strip comprising several tracks, each with a succession of alternating fine opaque zones and transparent zones and a reading assembly comprising, a light source and one or more photodetectors which detect for each track if it is an opaque zone or a transparent zone which is present in front of the photodetector(s). The disk or the strip, and the reading assembly on are mobile with respect to each other either in rotation (case of the disk) or in translation (case of the strip). In addition, an electronic unit may be associated with the photodetector(s) for processing the signals emitted by the photodetector(s).

Generally, the assembly of the foregoing components is disposed in a reduced volume or, when these means are distant from each other, conductors provide the electrical connections, particularly between the power supply means, the optoelectronic system forming the reading assembly and the electronic signal processing unit.

In some applications there exists a not inconsiderable distance between the reading assembly and the electronic signal processing unit. Any electrical connection between these two assemblies should be avoided because such a connection would risk being disturbed by outside interferences particularly in the case of analog transmission of the signals between the reading assembly and the electronic signal processing unit.

SUMMARY OF THE PRESENT INVENTION

The present invention aims at providing an optical apparatus for locating by diascopy the position of the mobile element distant from the electronic unit which processes the signals representing this position, while avoiding any outside interferences.

In accordance with the invention, a position locating apparatus is provided formed of three parts, namely:
(a) a data sensor which cooperates with the position code carrying element comprising the optically coded tracks;
(b) an optoelectronic module with an electronic signal processing unit; and
(c) optical bidirectional optical fiber transmission means.

The data sensor comprises, for cooperating with the position code carrying element comprising the optically coded tracks an optoeletronic reader disposed opposite the coded tracks for receiving the light passing through the transparent zones of the tracks and for transforming the light received into electric signals, an optoelectronic light emitter excited electrically by the optoelectronic reader and a self contained power supply source for supplying power to the the optoelectronic reader and the optoelectronic emitter.

The module comprises an optoelectronic light emitter and an optoelectronic reader, associated with the processing unit for the electric signals emitted by this optoelectronic reader in response to light signals. The power for the optoelectronic emitter and the optoelectronic reader of the module is provided by an electric power supply.

The optical transmission means comprises at least a first optical fiber for transmitting the light emitted by the optoelectronic emitter of the module to the optically coded tracks of the code carrying element and at least a second optical fiber for transmitting the light signals emitted by the optoelectronic emitter of the sensor to the optoelectronic reader of the module.

An optical system may be disposed in front of the optoelectronic reader of the sensor and in front of the optoelectronic reader of the module.

An optical system may be disposed between each optoelectronic emitter and the optical fiber(s) transmitting the light emitted by this emitter.

The self-contained power supply source of the sensor may be formed by an electric dry cell, a photovoltaic cell supplied with external light by an optical fiber or a local microgeneration power supply source.

The invention will in any case be well understood from the of description which follows and the accompanying drawings, which are given by way of example.

DESCRIPTION OF THE PREFERRED EMBODIMENTS

The invention is described hereafter in a preferred embodiment applying to the location of an angular position of the mobile member with axis X—X supporting, interlocked therewith in rotation, a coded disk 1 with several concentric coded tracks, each with a succession of very fine zones alternately opaque and transparent in the peripheral direction.

Figure 1:
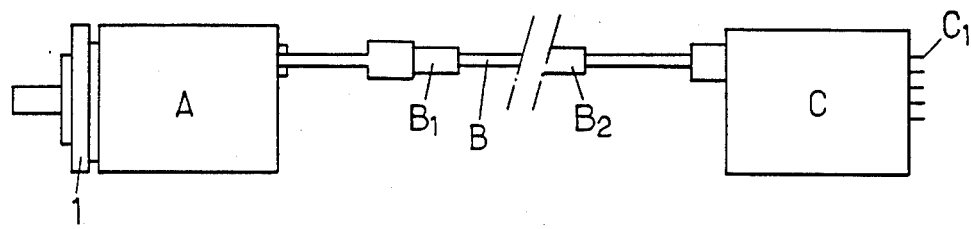
FIG. 1 illustrates schematically the whole of the optical position locating apparatus incorporating the improvements of the invention, showing its three component units, namely the sensor, the optical transmission means and the module.
Figure 2:
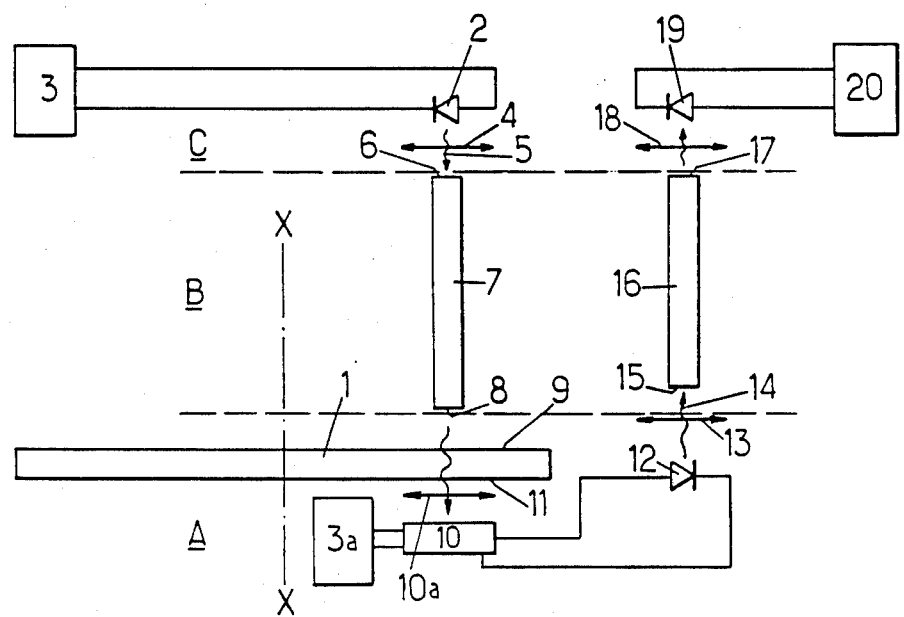
FIG. 2 illustrates the components of the three units illustrated in FIG. 1.

Referring more particularly to FIG. 2, in which the sensor A, the optical fiber light transmission system B formed for example by an optical cable with two or more fibers and the optoelectronic module (assemblies A,B and C which are to be found in FIG. 1) are separated by broken lines, it can be seen that the apparatus of the invention includes a first optoelectronic light emitter 2, formed for example by a light emitting diode and supplied by power supply means 3, for example external means formed by the general electricity source which is available.

An optical system 4 forms, from the light emitted by the light emitter 2, a beam of rays 5 which converge on the input face 6 of a first optical fiber 7 whose output face 8 is disposed opposite one of the surfaces 9 of the coded disk 1, namely opposite the coded tracks of this disk.

A first optoelectronic reader 10 is disposed opposite the other surface 11 of the coded disk 1, this optoelectronic reader transforms the light, received from the output face 8 of the first optical fiber 7 through a transparent zone of disk 11 and made convergent thereon by an optical system 10a, into electric pulses which reach a second optoelectronic emitter 12 formed for example (like the first emitter) by a light emitting diode. The optoelectronic reader 10 and the optoelectronic emitter 12 of the sensor A are supplied with power from a self contained source 3a formed for example by an electric dry cell, a photovoltaic cell supplied with external light by an optical fiber or a local power supply source by microgeneration. This latter source is advantageously formed by a system comprising a solenoid which surrounds a magnetic bar, a manometric capsule for controlling the relative solenoid/magnetic bar movement in the system, a rectifier whose input is connected to the terminals of the solenoid and an electric energy storage device connected to the output of the rectifier.

An optical system 13, similar to optical system 4 transforms the light emitted by diode 12 into a bundle of rays 14 which converge on the input face 15 of a second optical fiber 16 whose output face is illustrated at 17.

An optical system 18 focuses the light received from the face 17 of the optical fiber 16 on a second optoelectronic reader 19 formed for example by a photodetector. This second reader 19 supplies a processing unit 20 with the transmitted signals.

The optoelectronic reader 10 comprises several photodetectors (at least one per coded track on disk 1), an amplification and shaping circuit for the outputs of the photodetector(s) associated with each track and a shift register with parallel inputs (namely one input for each track) and a series output, this single output being connected to the light emitting diode 12 (not shown in the drawings).

The electronic assembly of the optoelectronic reader 10 is formed in accordance with technology which allows the reader to consume reduced electric power, particularly using CMOS type technology.

This reader 10 will then deliver, for each reading, a group of electric pulses and absences of pulses (in as many positions as there are coded tracks), an electric pulse corresponding to a transparent zone and an absence of pulse to an opaque zone of the track corresponding to the position in question. The successive readings result then in successive groups of pulses and absence of pulses, the pulses driving the light emitting diode 12. Finally, the photodetector 19 sends a succession of successive groups of pulses and absences of pulses (corresponding to the group of pulses and absences of pulses emitted by reader 10) to the processing unit 20.

FIG. 1 shows the units of sensor A with the coded disk 1, the optical cable B forming the optical fiber transmission device and module C with its outputs $C_1$ towards a device for using the output signals of module C.

The connectors $B_1$ and $B_2$ of the optical cable B for connecting, respectively, with the sensor A and the module C.

The operation of the apparatus comprises a first period of bringing into service lasting for about 0.5 to 1 second, in the case of photovoltaic current generation at 3a, but which may be of a different duration for another type of power source.

This period of bringing into service is followed by a first work cycle comprising the activation of the first optoelectronic emitter 2 and of the first associated optoelectronic reader 10. Then, after latching of the code in this reader 10, the series transmission of the code by activation of the second emitter and of the second optoelectronic reader, 12 and 19 respectively. This work period lasts about 50 µs.

Then a rest or recharge time is provided for the power source which may be of the order of 10 to 20 ms, at the end of which time a new work period may begin.

The result is then that the work-rest cycle may begin again for example about every 20 ms.

It can be seen that the optical fibers 7 and 16 and the associated optoelectronic systems serve for the remote transmission without risk of outside interferences, of the light emitted by diode 2 to disk 1 (fiber 7) and of the electric pulses emitted by reader 10 to the processing unit 20 (fiber 16).

As is evident, the invention is in no way limited to those modes of application and embodiments set forth above, but embraces all variations thereof within the scope of one of ordinary skill in the art.

What is claimed is:

1. A position locating apparatus comprising:
    (a) a data sensor for cooperating with a position code carrying element comprising optically coded tracks;
    (b) an optoelectronic module with an electronic signal processing unit; and
    (c) bidirectional optical transmission means;
        (i) said sensor including:
            a first optoelectronic reader disposed opposite said optically coded tracks for receiving light passing through transparent zones of said optically coded tracks and for transforming said light into electric signals,
            a first optoelectronic light emitter electrically excited by said optoelectronic reader, and
            a self-contained power source for supplying power to said optoelectronic reader and said optoelectronic emitter;
        (ii) said optoelectronic module including:
            a second optoelectronic light emitter,
            a second optoelectronic reader,
            a processing unit associated with said second optoelectronic reader for processing electric signals emitted by said second optoelectronic reader,
            a power supply for supplying power to said optoelectronic emitter and said optoelectronic reader; and
        (iii) said bidirectional optical transmission means including:
            at least a first optical fiber for transmitting light emitted by said second optoelectronic emitter to said optically coded tracks of said code carrying element, and
            at least a second optical fiber for transmitting light signals emitted by said first optoelectronic emitter to said second optoelectronic reader.

2. The position locating apparatus as claimed in claim 1, wherein an optical system is disposed in front of said first optoelectronic reader.

3. The position locating apparatus as claimed in claim 1, wherein an optical system is disposed between said first and second optoelectronic emitters and said bidirectional optical transmission means.

4. The position locating apparatus as claimed in claim 1, wherein said first optoelectronic reader comprises a plurality of photodetectors, at least one photodetector for each optically coded track of said code carrying element, a circuit for amplifying and shaping electric pulses delivered by each of said plurality of photodetectors corresponding to each optically coded track, and a shift register with parallel inputs, one input for each of said plurality of photodetectors and a single series output for outputting said electric signals to said first optoelectronic emitter.

5. The position locating apparatus as claimed in claim 4, wherein said plurality of photodetectors, said circuit and said shift register comprise CMOS substrates.

6. The position locating apparatus as claimed in claim 1, wherein said self-contained power source for said sensor comprises an electric dry cell.

7. The position locating apparatus as claimed in claim 1, wherein said self-contained power source for said sensor comprises a photovoltaic cell.

8. The position locating apparatus as claimed in claim 1, wherein said self-contained power source for said sensor comprises a local power supply source by microgeneration, including a solenoid which surrounds a magnetic bar, means for controlling relative solenoid/magnetic bar movement in the system, rectifier means whose input is connected to terminals of said solenoid and electric energy storage means connected to said output of said rectifier means.

9. The position locating apparatus as claimed in claim 2, wherein an optical system is disposed in front of said second optoelectronic reader.

* * * * *